(12) United States Patent
Terashima (10) Patent No.: US 6,605,829 B2
(45) Date of Patent: Aug. 12, 2003

(54) SEMICONDUCTOR DEVICE (75) Inventor: Tomohide Terashima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/988,171

(22) Filed: Nov. 19, 2001

(65) Prior Publication Data

US 2003/0006458 A1 Jan. 9, 2003

(30) Foreign Application Priority Data

Jul. 3, 2001 (JP) ........................................ 2001-201662

(51) Int. Cl.$^7$ ................................................. H01L 29/72
(52) U.S. Cl. ........................ 257/139; 257/335; 257/336; 257/338
(58) Field of Search ............................... 257/139, 335, 257/336, 338

(56) References Cited

U.S. PATENT DOCUMENTS 5,471,075 A * 11/1995 Shekar et al. ................ 257/139

FOREIGN PATENT DOCUMENTS

| JP | 2573736 | 10/1996 |
|---|---|---|
| JP | 2000-294786 | 10/2000 |

OTHER PUBLICATIONS

S. Merchant, et al. *"Realization of High Breakdown Voltage (> 700 V) in Thin SOI Devices,"* CH2987–6/91/0000–0031 $1.00,1991 IEEE, pp. 31–35.

* cited by examiner

*Primary Examiner*—Edward Wojciechowicz
(74) *Attorney, Agent, or Firm*—McDermott, Will & Emery (57) ABSTRACT

A DMOS transistor in which a main current flows between first and second main surfaces of a silicon substrate is formed. DMOS transistor has a p-type diffusion region formed in the first main surface, an n$^+$ diffusion region formed in the first main surface in p-type diffusion region, and a gate electrode facing p-type diffusion region sandwiched between n$^+$ diffusion region and n$^-$ layer via a gate insulating layer. A dielectric layer is formed in the silicon substrate so as to be adjacent to n$^-$ layer, and made of a material having a dielectric constant higher than that of silicon. Therefore, the semiconductor device which can be easily formed while suppressing increase in process cost and has an improved trade-off (effective on-state resistance) between a withstand voltage and on-state resistance by generating an electric field almost uniform in the direction of the thickness of a semiconductor substrate can be attained.

5 Claims, 5 Drawing Sheets

SEMICONDUCTOR DEVICE

BACKGROUND OF THE INVENTION

1. Field of the Invention

The present invention relates to a semiconductor device and, more particularly, a semiconductor device built in a discrete device or an IC (Integrated Circuit).

2. Description of the Background Art

Figure 7:
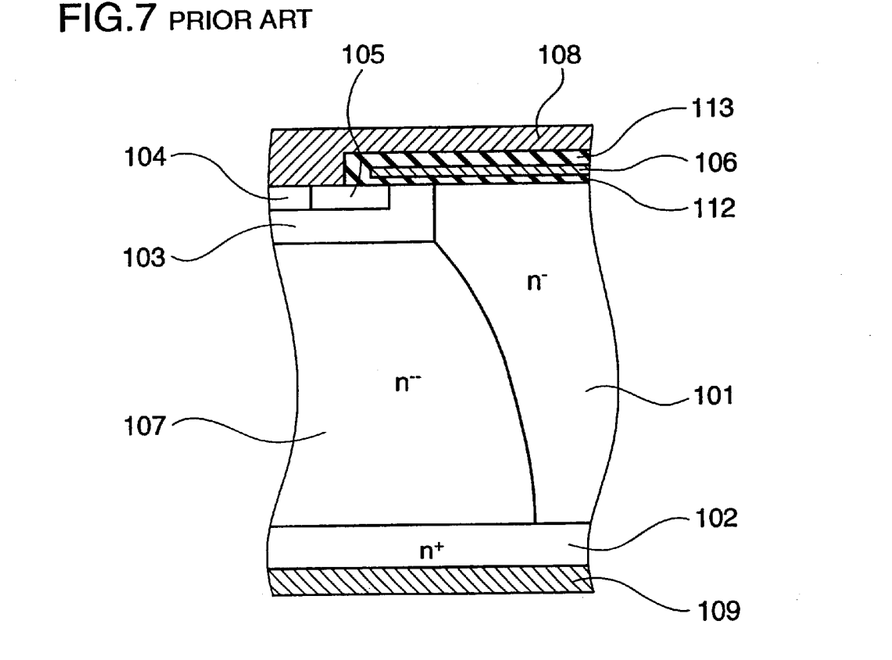
FIG. 7 is a cross section schematically showing the configuration of a semiconductor device in a first conventional technique.

FIG. 7 is a cross section schematically showing the configuration of a semiconductor device of a first conventional technique. Referring to FIG. 7, a DMOS (Double diffused Metal Oxide Semiconductor) transistor is formed in a semiconductor substrate. This DMOS transistor has, mainly, an $n^-$ layer 101, an $n^+$ layer 102, a p-type diffusion region 103, an $n^+$ diffusion region 105, a gate insulating layer 112, and a gate electrode layer 106.

$n^-$ layer 101 is formed deeply from a first main surface of the semiconductor substrate toward a second main surface side. p-type diffusion region 103 is formed so as to be in contact with $n^-$ layer 101 in the first main surface. In the first main surface in p-type diffusion region 103, $n^+$ diffusion region 105 is formed so as to be adjacent to $p^+$ diffusion region 104.

Gate electrode layer 106 is formed on the first main surface so as to face p-type diffusion region 103 sandwiched between $n^-$ layer 101 and $n^+$ diffusion region 105 via gate insulating layer 112. An insulating layer 113 is formed so as to cover gate electrode layer 106, and a source electrode 108 is formed so as to be connected to $n^+$ diffusion region 105 and $p^+$ diffusion region 104 which are exposed from insulating layer 113.

On the second main surface side of p-type diffusion region 103, $n^{--}$ layer 107 is formed so as to be in contact with $n^-$ layer 101. $n^{--}$ layer 107 has impurity concentration lower than that of $n^-$ layer 101. $n^+$ layer 102 is formed on the second main surface side of $n^-$ layer 101 and $n^{--}$ layer 107, and a drain electrode 109 is formed so as to be connected to $n^+$ layer 102.

Figure 8:
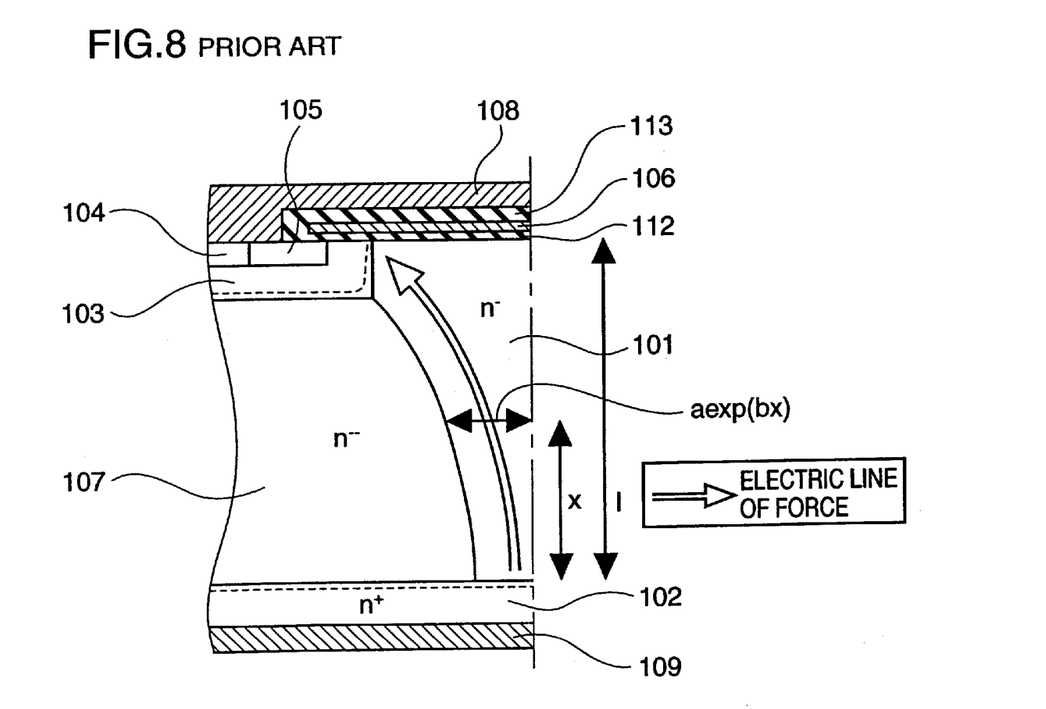
FIG. 8 is a diagram for explaining that the electric field becomes uniform in the first conventional technique.

In the first conventional technique, as shown in FIG. 8, $n^-$ layer 101 is formed so that its cross-sectional area in the lateral direction of the drawing is decreased from the source electrode side (first main surface side) toward the drain electrode side (second main surface side). $n^{--}$ layer 107 is formed so that its cross-sectional area in the lateral direction of the drawing increases by the same amount.

In the structure, when each of the source and gate is set to 0V and a positive bias is applied to the drain, the DMOS transistor enters a withstand checking state. At this time, a depletion layer extends, as shown by a dotted line in FIG. 8, in the entire area of $n^-$ layer 101 and $n^{--}$ layer 107 and a part of each of p-type diffusion are 103 and $n^+$ layer 102 which are in contact with $n^-$ layer 101 and $n^{--}$ layer 107.

Assuming now that the cross-sectional area in the lateral direction of the drawing of $n^-$ layer 101 decreases with an exp curve (exponential function curve), the concentration in $n^{--}$ layer 107 is sufficiently low, and the electric line of force hardly enters $n^{--}$ layer 107 side and that the electric field is uniform in the cross section in the lateral direction of the drawing of $n^-$ layer 101, the electric field in the cross section in a position (x) is derived by the following equation 1.

$$E(x)=(q/\epsilon)\cdot\{aN(\exp(bx)-1)/b+M\}/\{a(\exp(bx))\} \quad \text{(Equation 1)}$$

In the equation 1, q denotes an electronic charge, N indicates impurity concentration of $n^-$ layer 101, $\epsilon$ indicates a dielectric constant of silicon (Si), and M represents the number of space charges in $n^+$ layer 102. The position (x) denotes a distance between the junction of $n^-$ layer 101 and $n^+$ layer 102 and the source side.

When the relation of M=aN/b (equation 2) is satisfied in the equation 1, the equation 1 is expressed by the following equation 3.

$$E(x)=qN/(\epsilon b) \quad \text{(equation 3)}$$

By the equation 3, the electric field E(x) in the cross section in the lateral direction of FIG. 8 becomes always constant irrespective of the position (x). In the normal structure (structure in which there is no $n^{--}$ layer 107 in FIG. 7 but $n^-$ layer 101 is formed on the entire face), a step junction is formed. Consequently, the electric field decreases monotonously with distance from the source side toward the drain side. In contrast, in the structure shown in FIG. 7, a constant electric field can be obtained, so that $n^-$ layer 101 can be made thinner than that in the normal structure. As a result, by a trade-off between a withstand voltage and ON-state resistance (effective on-state resistance), the technique can exceed the limit of the normal structure.

In the first conventional technique, the cross-sectional area in the lateral direction of the drawing of $n^-$ layer 101 decreases with distance from the source side toward the drain side. Consequently, there is a structural optimum value in the relation with the resistance in $n^-$ layer 101. The resistance in the direction from the source side toward the drain side in the first conventional technique is obtained by the following equation 4. Specific resistance of $n^-$ layer 101 is similar to $\alpha/N$.

$$R=\alpha/N\cdot\int 1/a\cdot\exp(-bx)dx=\alpha/Nab\cdot(1-\exp(-bl)) \quad \text{(equation 4)}$$

$\alpha$ in the equation 4 denotes a factor of proportionality of the specific resistance and impurity concentration. In the equation 4, to reduce the resistance, it is optimum that there is no $n^{--}$ layer 107 on the source side and $n^-$layer 101 is formed in the entire surface. Consequently, effective ON-state resistance RS becomes the minimum in the following equation.

$$RS=R\cdot a\cdot\exp(bl)=\alpha/(Nb)\cdot(\exp(bl)-1)$$

From the equation 3, N/b is a constant. When N/b is set as $\beta$, the effective ON-state resistance RS is expressed as the following equation 5.

$$RS=\alpha\cdot\beta/(N\cdot N)\cdot(\exp(Nl/\beta)-1) \quad \text{(equation 5)}$$

Since the function becomes the minimum when $Nl/\beta\approx1.6$, the optimum impurity concentration N which minimizes the effective ON-state resistance RS exists, and the result b is also determined. Therefore, the optimum value exists in the entire structure.

A second conventional technique will be described as another technique.

Figure 9:
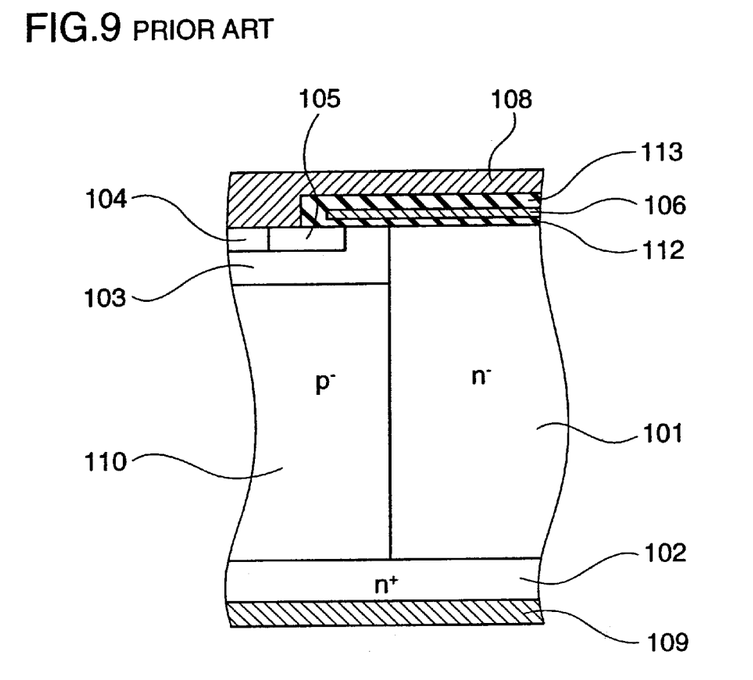
FIG. 9 is a cross section schematically showing the configuration of a semiconductor device in a second conventional technique.
Figure 10:
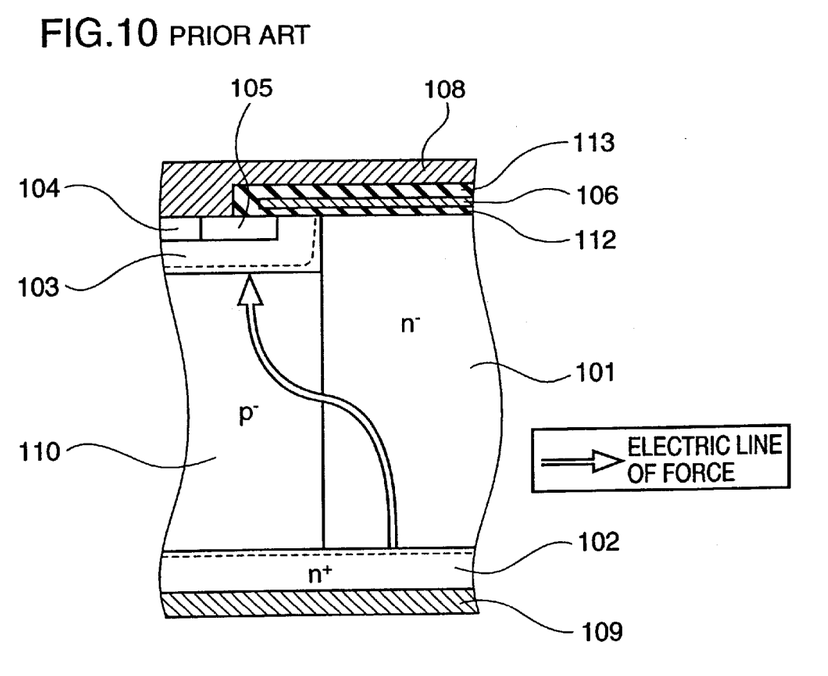
FIG. 10 is a diagram for explaining that the electric field becomes uniform in the second conventional technique.

FIG. 9 is a cross section schematically showing the configuration of a semiconductor device in the second conventional technique. Referring to FIG. 9, in the second conventional technique, in place of $n^{--}$ layer 107 shown in FIG. 7, a $p^-$ layer 110 is formed. The pn junction between $p^-$ layer 110 and $n^-$ layer 101 extends almost in the direction perpendicular to the first and second main surfaces of the semiconductor substrate (thickness direction). The impurity concentration of $p^-$ layer 110 and that of $n^-$ layer 101 are controlled to be the same, thereby obtaining the same effect as that of the first conventional technique.

Since the configuration other than the above is substantially the same as that of the above-described first conventional technique, the same components are designated by the same reference numerals and their description will not be repeated.

In the second conventional technique, by providing p⁻ layer 110, the electric line of force from the space charge of n⁻ layer 101 enters p⁻ layer 110 side at a predetermined rate. Consequently, as the electric line of force extends from the drain side toward the source side, it extends from the inside of n⁻ layer 101 and gradually enters p⁻ layer 110 side, so that the electric field in n⁻ layer 101 is maintained to be constant. By the effect, the electric field of n⁻ layer 101 becomes almost uniform except for an area around p-type diffusion region 103 and n⁺ layer 102, so that an effect similar to that of the first conventional technique can be obtained.

As a result, to prevent an increase in density of electric line of force in both of the configurations of the first and second conventional techniques, the shape of n⁻ layer 101 is controlled so that, in the first conventional technique, the electric line of force always extends. In the second conventional technique, p⁻ layer 110 of the opposite conduction type for terminating the electric line of force is disposed.

Further, the second conventional technique is characterized in that the performance can be improved by making the pattern in the lateral direction of the drawing finer for the following reason. Even if the pattern in the lateral direction is reduced to the half of the whole in the configuration of the second conventional technique, when the space charge is the same value, a similar operation can be performed. By doubling the impurity concentration of n⁻ layer 101, an operation can be performed in a manner similar to that before the pattern is made finer. Since the cross-sectional area in the lateral direction of the drawing of n⁻ layer 101 in the device area is reduced at a predetermined rate, simply, the resistance can be reduced to the half by the same withstand voltage. As described above, the second conventional technique has an advantage such that the improved effective ON-state resistance can be obtained by making the pattern finer.

The structures of the first and second conventional techniques have, however, the following problems.

The configuration of the first conventional technique has a problem such that, it is difficult to accurately control the structure in which the cross-sectional area in the lateral direction of the drawing of n⁻ layer 101 decreases with distance from the source side toward the drain side and, in a normal process, an actual effect is smaller with respect to the performance theoretically expected.

The configuration of the second conventional technique has a problem such that means which largely increases the process cost is required such as multiple epitaxial growth to balance the concentration in n⁻ layer 101 and the concentration in p⁻ layer 110 and to form the pn junction between n⁻ layer 101 and p⁻ layer 110 perpendicularly to the first and second main surfaces and deeply to a certain extent and, further, it is difficult to control the means.

Although the second conventional technique has the advantage such that the effective ON-state resistance can be improved by narrowing the pattern in the lateral direction of the drawing as described above, it also has a problem such that the formation of the finer pattern in the lateral direction of the drawing requires a more difficult process.

SUMMARY OF THE INVENTION

An object of the invention is to provide a semiconductor device which can be easily formed while suppressing increase in process cost and has an improved trade-off (effective ON-state resistance) between a withstand voltage and ON-state resistance by generating an electric field almost uniform in the direction perpendicular to the surface of a semiconductor substrate.

A semiconductor device of the invention has a silicon substrate of a first conduction type, an insulated gate type field effect transistor, and a dielectric layer. The silicon substrate has first and second main surfaces facing each other. In the insulated gate type field effect transistor, a main current flows between the first main surface and the second main surface. The insulated gate type field effect transistor has: a first impurity region of a second conduction type formed in the first main surface; a second impurity region of the first conduction type formed in the first impurity region; a gate electrode layer facing the first impurity region sandwiched between a first conduction type region in the silicon substrate and the second impurity region via a gate insulating layer; and a dielectric layer formed in the silicon substrate so as to be adjacent to the first conduction type region in the silicon substrate and made of a material having a dielectric constant higher than that of silicon.

In the semiconductor device according to the invention, the dielectric layer having a dielectric constant higher than that of silicon is formed so as to be adjacent to the first conduction type region in the silicon substrate. Consequently, in a withstand voltage device state, an electric line of force generated in the silicon substrate gradually enters the dielectric layer from the first conduction type region with distance from the drain side toward the source side. It can make the electric field almost uniform in the depth direction of the substrate in the first conduction type region. Thus, the thickness of the first conduction type region can be reduced and, as a result, the trade-off between the withstand voltage and on-state resistance (effective on-state resistance) can be improved.

It is sufficient to form the dielectric layer so as to be adjacent to the first conduction type region. Unlike the first conventional technique, it is unnecessary to change the cross-sectional area in the depth direction of the substrate. Unlike the second conventional technique, it is unnecessary to control the impurity concentrations of the regions of opposite conduction types neighboring to each other to the same. Consequently, the device can be easily fabricated and an increase in process cost can be suppressed.

When the space charge in the first conduction type region is the same, even when the pattern is reduced in the direction of the first and second main surfaces of the substrate (lateral direction), an effect similar to the above can be obtained. Concretely, even when the pattern is reduced to the half in the lateral direction, when the impurity concentration of the first conduction type region is doubled and the same space charge as that before the pattern is reduced is set, an operation similar to that before reduction of the pattern can be performed. Therefore, while improving an trade-off between the withstand voltage and the on-state resistance, the size of the device can be reduced.

In the semiconductor device, preferably, the dielectric layer is constructed so that the dielectric constant decreases with distance from the first main surface side toward the second main surface side.

With the configuration, the dielectric layer can be controlled so that the distribution opposite to the distribution of the electric field in the first conduction type region in the withstand voltage device state can be set, so that the charge can be generated uniformly.

In the semiconductor device, preferably, the dielectric layer is formed on the second main surface side immediately below the gate electrode layer.

With the configuration, occurrence of resistance of a junction type field effect transistor can be prevented, so that the on-state resistance can be further improved and the fabrication is also facilitated.

Preferably, the semiconductor device is further provided with a region of the second conduction type formed between the dielectric layer and the first conduction type region in the silicon substrate.

With the configuration, an effect of terminating the electric line of force by depleting the second conduction type region in the withstand voltage device state is produced. Even when the dielectric constant of the dielectric layer is set to be low, an improved trade-off between the withstand voltage and the on-state resistance can be achieved.

In the semiconductor device, preferably, the dielectric layer becomes wider and the first conduction type region in the silicon substrate becomes narrower with distance from the first main surface side toward the second main principal side.

Thus, an effect of extending the depletion layer toward the first conduction type region side is obtained in a manner similar to the first conventional technique. Even when the dielectric constant of the dielectric layer is set to be low, an improved trade-off between the withstand voltage and the on-state resistance can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described hereinbelow with reference to the drawings.

Figure 1:
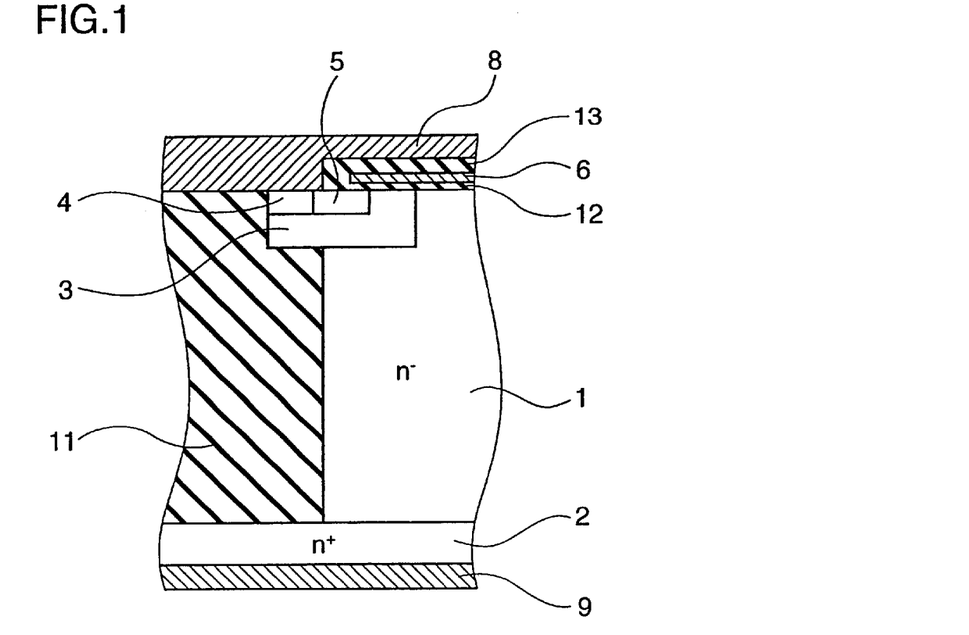
FIG. 1 is a cross section schematically showing the configuration of a semiconductor device in a first embodiment of the invention.

Referring to FIG. 1, a DMOS transistor is formed in a semiconductor substrate made of, for example, silicon. This DMOS transistor has, mainly, an $n^-$ layer 1, an $n^+$ layer 2, a p-type diffusion region 3, an $n^+$ diffusion region 5, a gate insulating layer 12, and a gate electrode layer 6.

$n^-$ layer 1 is adjacent to a dielectric layer 11 and formed deeply from a first main surface of the semiconductor substrate toward a second main surface side. p-type diffusion region 3 is formed at the boundary of $n^-$ layer 1 and dielectric layer 11 and in the first main surface. In the first main surface in p-type diffusion region 3, $n^+$ diffusion region 5 is formed so as to be adjacent to a $p^+$ diffusion region 4.

Gate electrode layer 6 is formed on the first main surface so as to face p-type diffusion region 3 sandwiched between $n^-$ layer 1 and $n^+$ diffusion region 5 via gate insulating layer 12. An insulating layer 13 is formed so as to cover gate electrode layer 6, and a source electrode 8 is formed so as to be connected to $n^+$ diffusion region 5 and $p^+$ diffusion region 4 which are exposed from insulating layer 13.

Dielectric layer 11 is made of a material having a dielectric constant higher than that of silicon, which is uniform on the whole. The junction between $n^-$ layer 1 and dielectric layer 11 extends almost perpendicular to the first and second main surfaces of the semiconductor substrate. On the second main surface side of $n^-$ layer 1 and dielectric layer 11, $n^+$ layer 2 is formed. To $n^+$ layer 2, a drain electrode 9 is connected.

A withstand voltage checking state of the structure can be considered as follows.

Figure 2:
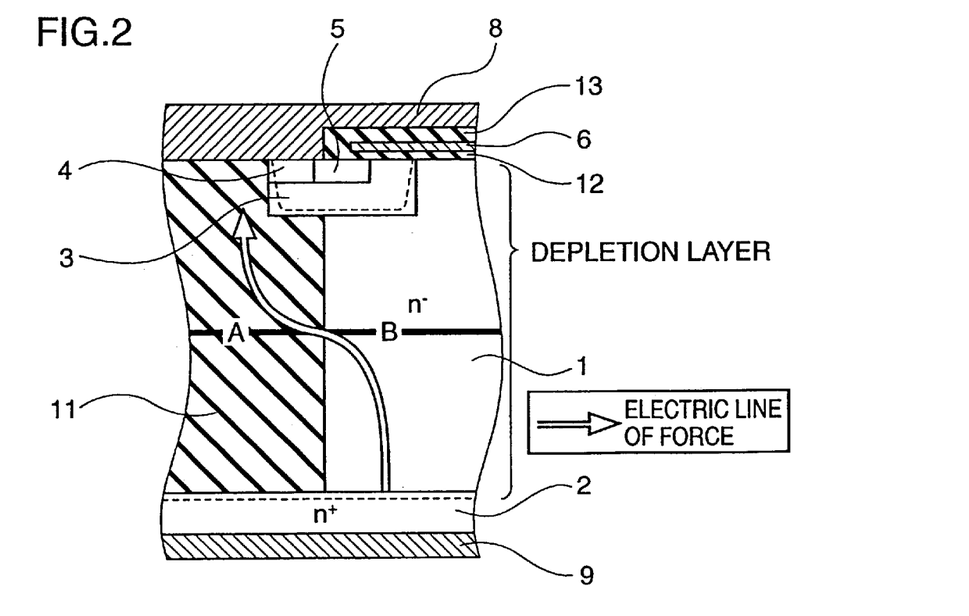
FIG. 2 is a diagram for explaining that an electric field becomes uniform in the first embodiment of the invention.

When it is assumed that a positive bias Vd is applied to drain electrode 9 to obtain an OFF state and that there are electrodes A and B as shown in FIG. 2 in the middle between the source and the drain, the potentials of the electrodes A and B will be considered. Assuming now that $n^-$ layer 1 and dielectric layer 11 are apart from each other, since dielectric layer 11 side has an equipotential, obviously the potential of electrode A is Vd/2. On the other hand, on $n^-$ layer 1 side, since the electric field monotonously decreases with distance from the source toward the drain, the potential of electrode B is higher than Vd/2. When it is now assumed that dielectric layer 11 and $n^-$ layer 1 come into contact with each other and electrodes A and B come into contact with each other, the potential of the integrated electrodes A and B becomes extremely close to Vd/2 because the potential of a series capacitor is determined by an equivalent capacitor on the side of dielectric layer 11 having a large capacity.

As a result, the electric line of force is formed so as to gradually enter dielectric layer 11 side from the inside of $n^-$ layer 1 with distance from the drain side toward the source side and enter a state similar to that of the second conventional technique. As described above, the electric line of force from the space charge of $n^-$ layer 1 goes out to the dielectric layer 11 side at a predetermined rate, thereby maintaining the electric field in $n^-$ layer 1 to be constant. By the effect, the electric field in the entire area of $n^-$ layer 1 and dielectric layer 11 except for areas near p-type diffusion region 3 and $n^+$ layer 2 becomes almost uniform. It enables the thickness of $n^-$ layer 1 to be reduced and, as a result, by the trade-off (effective ON-state resistance) between the withstand voltage and the ON-state resistance, the invention can exceed the limit of the normal structure.

In the second conventional technique, by combining the finer pattern in the lateral direction and the higher concentration in n⁻ layer 1, further improved effective ON-state resistance can be achieved. A similar effect can be also obtained by the embodiment. It is assumed that the pattern is narrowed to the half in the lateral direction of the drawing and the impurity concentration in n⁻ layer 1 is doubled. In this case, it is understood that even in a state where a depletion layer is widened over the entire area of n⁻ layer 1, the capacity ratio between electrodes A and B (FIG. 2) is unchanged since the pattern is narrowed. As described above, while maintaining the effect of improved effective ON-state resistance, the pattern can be narrowed.

According to the embodiment, in theory, by changing only the impurity concentration in n⁻ layer 1, while maintaining the effect of improved effective ON-state resistance, the pattern can be narrowed. Unlike the second conventional technique, it is unnecessary to increase the impurity concentration in n⁻ layer 101 and that in p⁻ layer 110 synchronously.

Further, in the second conventional technique, when the impurity concentration in each of n⁻ layer 101 and p⁻ layer 110 becomes too high, a problem such that an avalanche current flows in the pn junction of the layers before both of the layers completely deplete occurs. The problem can be also solved by the embodiment.

In the embodiment, the interface between silicon and dielectric layer 11 corresponds to the pn junction. The avalanche phenomenon is a phenomenon which occurs only on the silicon side where carries can travel. For the phenomenon, a positive feedback loop for avalanche multiplication in both of an electron and a hole is necessary for an electron-hole pair generated in an electric field peak portion. In the embodiment, however, there is no positive feedback by a hole current, so that the critical electric field in the interface becomes stronger as compared with that in the normal pn junction. Particularly, when the thickness of n⁻ layer 1 becomes about 1 $\mu$m or less, an effect that a distance necessary for avalanche multiplication is insufficient is also added, so that the critical electric field becomes extremely strong. Therefore, the impurity concentration in n⁻ layer 1 can be accordingly increased, and the effective ON-state resistance can be further improved.

According to a method of fabricating the semiconductor device of the embodiment, a groove is formed in the surface of the silicon substrate by using, for example, anisotropic etching and, while protecting the surface with a thermal oxide film or the like, and the groove is filled with dielectric layer 11 made of a material having a high dielectric constant. A promising material having a high dielectric constant to be used as a material of dielectric layer 11 is a metal oxide applied for a memory or the like.

Preferably, as the metal oxide, for example, each of or an arbitrary combination of tantalum oxide ($Ta_2O_5$), lead zirconate titanate (PZT), lead lanthanum zirconate titanate (PLZT), strontium titanate (STO), and barium titanate (BTO) is used. Since a metal oxide material has excellent thermal conductivity, it is convenient to use the material for a power of high power consumption. As it is considered that the thermal oxide film can be omitted or thinned by an improved process technique, improvement in thermal conductivity can be also expected.

In the embodiment, it is sufficient to form dielectric layer 11 so as to be adjacent to n⁻ layer 1. Unlike the first conventional technique, it is unnecessary to change the cross-sectional area of n⁻ layer 101 in the depth direction of the substrate. Unlike the second conventional technique, it is unnecessary to control the impurity concentrations of n⁻ layer 101 and p⁻ layer 110 which are adjacent to each other to be the same. Consequently, according to the embodiment, the semiconductor device can be easily fabricated, and an increase in process cost can be suppressed.

When the DMOS transistor is in an ON state, a channel is formed in p-type diffusion region 3 facing gate electrode 6, and a main current flows between the first and second main surfaces of the semiconductor substrate.

Second Embodiment

Figure 3:
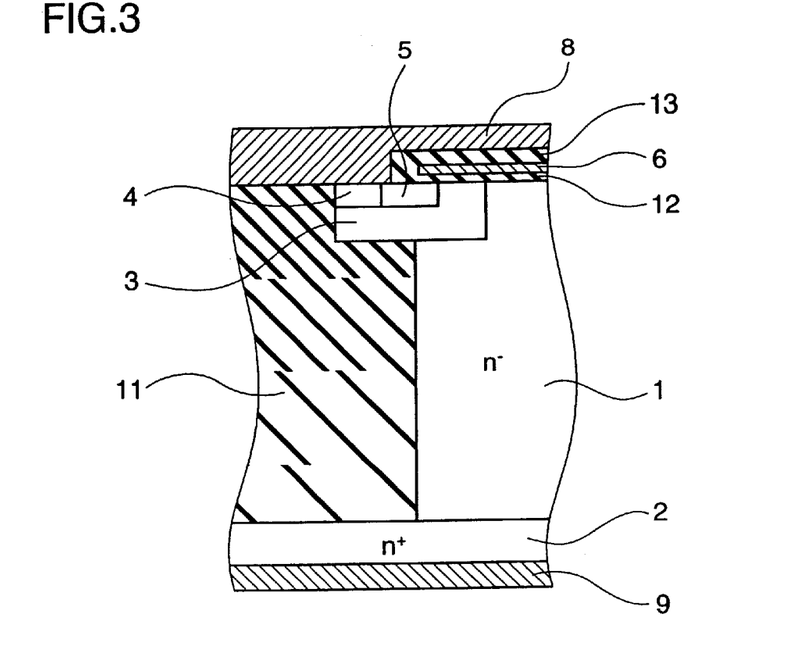
FIG. 3 is a cross section schematically showing the configuration of a semiconductor device in a second embodiment of the invention.

Referring to FIG. 3, the configuration of a second embodiment is different from that of the first embodiment with respect to the point that the dielectric constant of dielectric layer 11 decreases with distance from the source side toward the drain side. The dielectric constant in a position near the source of dielectric layer 11 is higher than that of silicon. Although a change in dielectric constant of dielectric layer 11 is preferably continuous, it may be a discontinuous change.

Since the other configuration is substantially the same as that of the foregoing first embodiment, the same components are designated by the same reference numeral and the description will not be repeated.

The hatching in dielectric layer 11 in FIG. 3 is successively changed to show the state where the dielectric constant of dielectric layer 11 changes in the thickness direction of the substrate.

The effect of the first embodiment is produced based on that the capacity of dielectric layer 11 is sufficiently large and is not influenced by the silicon side. On the other hand, in the second embodiment, to make the electric field in the interface between n⁻ layer 1 and dielectric layer 11 finally constant, the electric field distribution in dielectric layer 11 is preliminarily set so as to be opposite to that in the thickness direction of the substrate of n⁻ layer 1 in the withstand voltage checking state.

In the second embodiment as well, in a manner similar to electrodes A and B (FIG. 2) in the first embodiment, since the electric flux density is constant, the potential at the middle point in dielectric layer 11 is lower than Vd/2. On the other hand, the potential at the middle point in n⁻ layer 1 is higher than Vd/2 as described above. By balancing the two potentials, a uniform electric field can be generated. In this method, since the dielectric constant of dielectric layer 11 is changed in the thickness direction of the substrate, even when the dielectric constant of dielectric layer 11 is set to be lower than that in the first embodiment, an effect similar to that of the first embodiment can be obtained.

Third Embodiment

Figure 4:
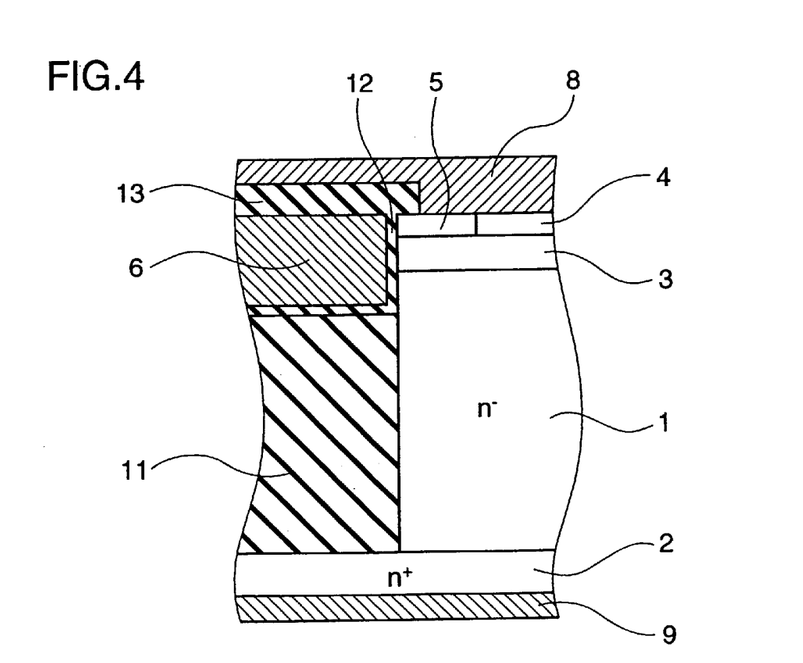
FIG. 4 is a cross section schematically showing the configuration of a semiconductor device in a third embodiment of the invention.

Referring to FIG. 4, the configuration of a third embodiment is different from that of the first embodiment with respect to the point that gate electrode 6 has a trench gate structure and dielectric layer 11 is positioned directly below gate electrode 6 on the second principle face side.

p-type diffusion region 3 is formed in the first principle face of n⁻ layer 1, and n⁺ diffusion region 5 and p⁺ diffusion region 4 are formed so as to be adjacent to each other in the first main surface in p-type diffusion region 3. Gate electrode 6 is formed in the groove provided in the first main surface of the semiconductor substrate so as to face p-type diffusion region 3 sandwiched by n⁻ layer 1 and n⁺ diffusion region 5 via gate insulating layer 12. On the second main surface side directly below gate electrode 6, dielectric layer 11 is positioned via insulating layer 12.

Since the other configuration is substantially the same as that of the foregoing first embodiment, the same components are designated by the same reference numerals and their description will not be repeated.

In the embodiment, since dielectric layer 11 is formed directly below the trench gate structure portion, there is no JFET (junction field effect transistor) resistance generated between dielectric layer 11 and p-type diffusion region 3. Thus, improved effective ON-state resistance can be achieved.

The structure in which dielectric layer 11 is charged to some midpoint of the groove formed finely and gate electrode 6 is formed on dielectric layer 11 can be easily fabricated from a process viewpoint.

Obviously, by distributing the dielectric constant of dielectric layer 11 in a manner similar to the second embodiment, an effect similar to that of the second embodiment can be obtained.

Fourth Embodiment

Figure 5:
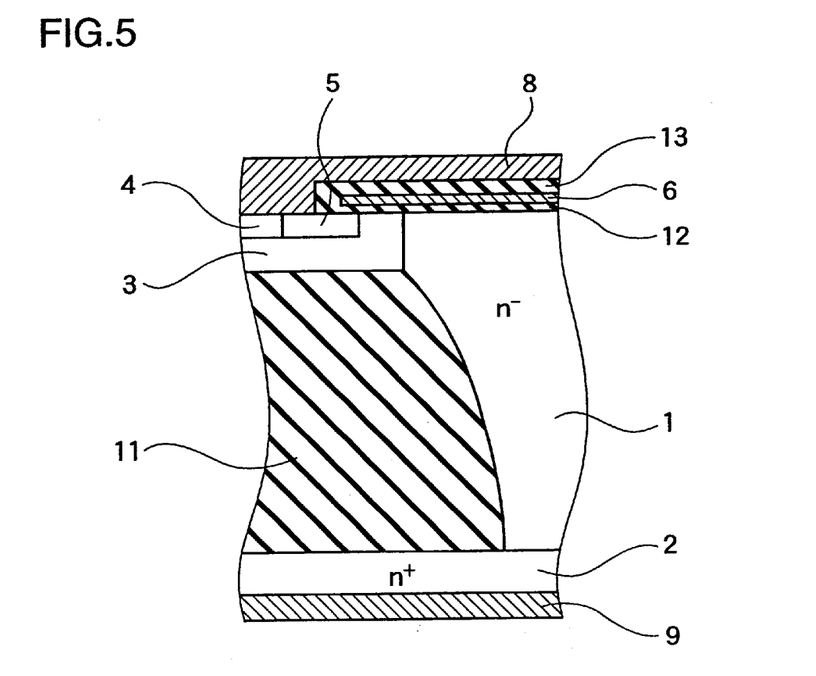
FIG. 5 is a cross section schematically showing the configuration of a semiconductor device in a fourth embodiment of the invention.

Referring to FIG. 5, the configuration of a fifth embodiment is different from that of the first conventional technique shown in FIG. 7 with respect to the point that $n^{--}$ layer 107 is replaced by dielectric layer 11.

Since the other configuration is substantially the same as that of the foregoing first conventional technique, the same components are designated by the same reference numerals and the description will not be repeated.

According to the embodiment, the cross-sectional area in the lateral direction of the drawing of $n^-$ layer 1 decreases with distance from the source side toward the drain side. Consequently, by a combination of an effect produced by using dielectric layer 11 and an effect of the decrease in the cross-sectional area of $n^-$ layer 1, improved ON-state resistance can be achieved.

In the case of improving the effective ON-state resistance similar to that of the first embodiment by using the configuration of the fourth embodiment, the dielectric constant of dielectric layer 11 can be made lower than that of the first embodiment.

By distributing the dielectric constant of dielectric layer 11 in a manner similar to the second embodiment, an effect similar to that of the second embodiment can be obtained.

Fifth Embodiment

Figure 6:
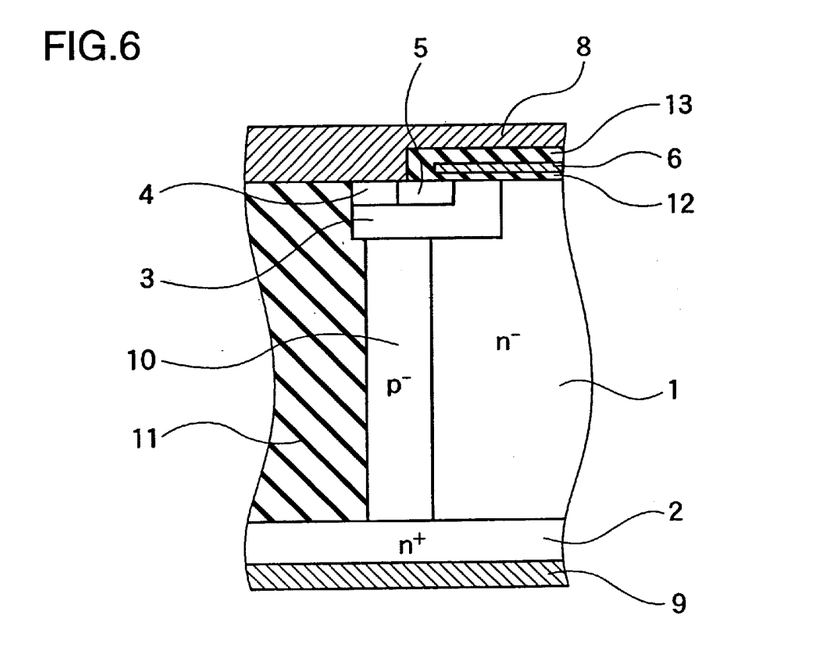
FIG. 6 is a cross section schematically showing the configuration of a semiconductor device in a fifth embodiment of the invention.

Referring to FIG. 6, the embodiment of a fifth embodiment is different from that of the first embodiment with respect to the point that $p^-$ layer 10 is sandwiched between dielectric layer 11 and $n^-$ layer 1.

Since the other configuration is substantially the same as that of the foregoing first embodiment, the same components are designated by the same reference numerals and the description will not be repeated.

According to the embodiment, by depleting $p^-$ layer 10, in addition to the effect of the first embodiment, an effect similar to that of the second conventional technique of terminating the electric line of force can be obtained. By setting the dielectric constant of dielectric layer 11 to be lower than that of the first embodiment or forming a pattern more finely, an effect that improved effective ON-state resistance similar to that of the first embodiment can be obtained.

By distributing the dielectric constant of dielectric layer 11 in a manner similar to the second embodiment, an effect similar to that of the second embodiment can be also obtained.

As another method of forming $p^-$ layer 10, a process of forming a groove in a silicon substrate by anisotropic etching and diffusing a p-type impurity to the side walls of the groove is added to the fabricating method of the first or third embodiment.

In the semiconductor device of each of the foregoing embodiments, the conduction types of the n and p types of the impurity regions may be reversed.

The embodiments disclosed here are to be considered in all respects as illustrative and not restrictive. The scope of the invention is indicated by the appended claims rather than by the foregoing description and all changes which come within the meaning and range of equivalency of the claims are therefore intended to be embraced therein.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a silicon substrate of a first conduction type having first and second main surfaces facing each other; and     an insulated gate type field effect transistor in which a main current flows between said first main surface and said second main surface,     said insulated gate type field effect transistor comprising:

a first impurity region of a second conduction type formed in said first main surface;

a second impurity region of the first conduction type formed in said first impurity region;

a first conduction type region in said silicon substrate extending between said first and second main surfaces, wherein said first impurity region is sandwiched between said first conduction type region and said second impurity region;

a gate electrode layer facing said first impurity region with a gate insulating layer interposed therebetween; and         a dielectric layer extending between said first and second main surfaces formed in said silicon substrate so as to be adjacent to said first conduction type region in said silicon substrate and made of a material having a dielectric constant higher than that of silicon.

2. The semiconductor device according to claim 1, wherein said dielectric layer is constructed so that the dielectric constant decreases with distance from said first main surface side toward said second main surface side.

3. The semiconductor device according to claim 1, wherein said dielectric layer is formed at said second main surface side immediately below said gate electrode layer.

4. The semiconductor device according to claim 1, further comprising a third impurity region of the second conduction type formed between said dielectric layer and said first conduction type region in said silicon substrate.

5. The semiconductor device according to claim 1, wherein said dielectric layer becomes wider and said first conduction type region in said silicon substrate becomes narrower with distance from said first main surface side toward said second main surface side.

\* \* \* \* \*

UNITED STATES PATENT AND TRADEMARK OFFICE
CERTIFICATE OF CORRECTION

PATENT NO. : 6,605,829 B2
DATED : August 12, 2003
INVENTOR(S) : Tomohide Terashima It is certified that error appears in the above-identified patent and that said Letters Patent is hereby corrected as shown below:

<u>Title page,</u>
Item [56], References Cited, U.S. PATENT DOCUMENTS, add:
-- 5,164,804   *   11/1994       Terashima ..................... 257/487 --

Signed and Sealed this

Twentieth Day of January, 2004

JON W. DUDAS
*Acting Director of the United States Patent and Trademark Office*